(12) United States Patent
Sakano

(10) Patent No.: US 11,531,063 B2
(45) Date of Patent: Dec. 20, 2022

(54) SUPPORT DEVICE, DESIGN SUPPORT SYSTEM, ELECTRICAL DEVICE, AND DESIGN SUPPORT METHOD

(71) Applicant: KABUSHIKI KAISHA TOSHIBA, Tokyo (JP)

(72) Inventor: Tatsunori Sakano, Shinagawa Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 17/411,888

(22) Filed: Aug. 25, 2021

(65) Prior Publication Data

US 2022/0221511 A1 Jul. 14, 2022

(30) Foreign Application Priority Data

Jan. 14, 2021 (JP) .............................. JP2021-004501

(51) Int. Cl.
*G01R 31/00* (2006.01)
*G01R 31/317* (2006.01)
*G06N 7/00* (2006.01)

(52) U.S. Cl.
CPC . *G01R 31/31725* (2013.01); *G01R 31/31712* (2013.01); *G01R 31/31721* (2013.01); *G06N 7/005* (2013.01)

(58) Field of Classification Search
CPC ........ G01R 31/31725; G01R 31/31712; G01R 31/31721; G06N 7/005
See application file for complete search history.

(56) References Cited

U.S. PATENT DOCUMENTS

| 8,789,002 B2* | 7/2014 | Tanaka | H01L 27/0207 |
| | | | 716/132 |
| 2009/0064070 A1* | 3/2009 | Kitahara | G06F 30/39 |
| | | | 716/113 |
| 2015/0161307 A1* | 6/2015 | Ueki | G06F 30/367 |
| | | | 716/136 |

FOREIGN PATENT DOCUMENTS

JP 2019-154134 A 9/2019

* cited by examiner

*Primary Examiner* — Christine T. Tu
(74) *Attorney, Agent, or Firm* — Finnegan, Henderson, Farabow, Garrett & Dunner, LLP

(57) ABSTRACT

According to one embodiment, a design support device executes a first processing. The first processing includes setting a control value group for a semiconductor element. The semiconductor element includes gates including first and second gates. The control value group includes a first time difference between first and second timings. A voltage is applied to the first gate at the first timing. A voltage is applied to the second gate at the second timing. The first processing includes calculating a characteristic value from an output result when an electrical signal corresponding to the control value group is input to the semiconductor element. The first processing includes calculating a first function from history data including not less than one data set. The data set includes the control value group and a score based on the characteristic value. The design support device sets a new control value group.

11 Claims, 14 Drawing Sheets

SUPPORT DEVICE, DESIGN SUPPORT SYSTEM, ELECTRICAL DEVICE, AND DESIGN SUPPORT METHOD

CROSS-REFERENCE TO RELATED APPLICATIONS

This application is based upon and claims the benefit of priority from Japanese Patent Application No. 2021-004501, filed on Jan. 14, 2021; the entire contents of which are incorporated herein by reference.

FIELD

Embodiments described herein relate generally to a design support device, a design support system, an electrical device, and a design support method.

BACKGROUND

There is a need for technology that can more efficiently search for a control value relating to multiple gates of a semiconductor element.

DETAILED DESCRIPTION

Figure 1:
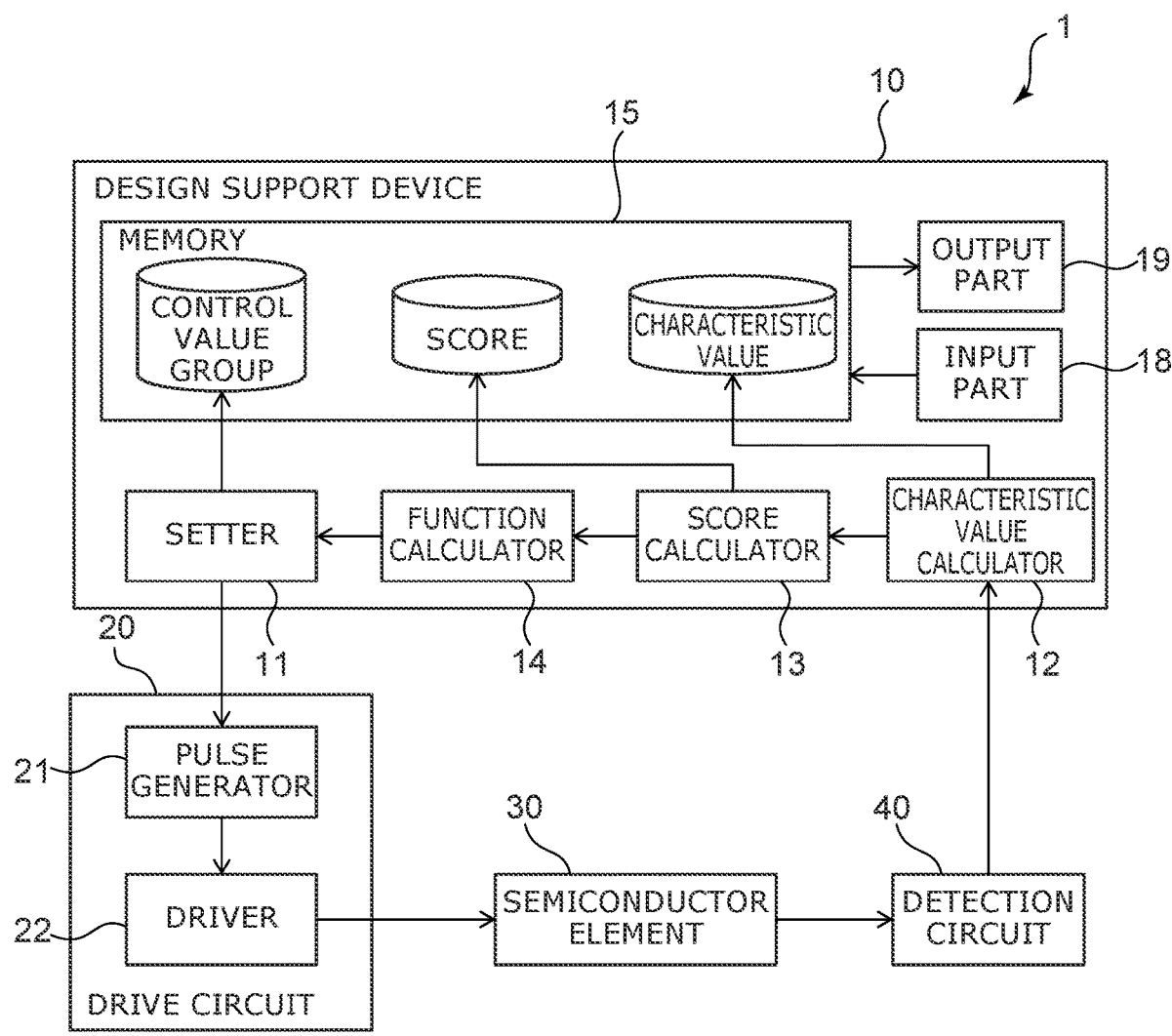
FIG. 1 is a block diagram showing a functional configuration of a design support system according to an embodiment.

According to one embodiment, a design support device executes a first processing. The first processing includes setting a control value group for a semiconductor element. The semiconductor element includes a plurality of gates. The gates include a first gate and a second gate. The control value group includes a first time difference between a first timing and a second timing. A voltage is applied to the first gate at the first timing. A voltage is applied to the second gate at the second timing. The first processing includes calculating a characteristic value from an output result when an electrical signal corresponding to the control value group is input to the semiconductor element. The characteristic value indicates a characteristic of the semiconductor element. The first processing includes calculating a first function from history data including not less than one data set. The data set includes the control value group and a score based on the characteristic value. The design support device sets a new control value group by using the first function.

Various embodiments are described below with reference to the accompanying drawings. In the specification and drawings, components similar to those described previously or illustrated in an antecedent drawing are marked with like reference numerals, and a detailed description is omitted as appropriate.

FIG. 1 is a block diagram showing a functional configuration of a design support system according to an embodiment.

As shown in FIG. 1, the design support system 1 includes a design support device 10, a drive circuit 20, a semiconductor element 30, and a detection circuit 40.

The design support system 1 and the design support device 10 are used to set a control value group that relates to the semiconductor element 30. The semiconductor element 30 includes multiple gates that include a first gate and a second gate. The semiconductor element 30 includes an insulated gate bipolar transistor (IGBT). The semiconductor element 30 may include a reverse-conducting IGBT (RC-IGBT) that includes a diode and an IGBT. The control value group includes a first time difference between a first timing at which a voltage is applied to the first gate and a second timing at which a voltage is applied to the second gate. The control value group is searched by the design support device 10.

The design support device 10 sets the control value group. The drive circuit 20 inputs an electrical signal corresponding to the control value group to the semiconductor element 30. The detection circuit 40 detects the output of the semiconductor element 30 when the electrical signal is input to the semiconductor element 30. The detection circuit 40 transmits the detected output result to the design support device 10. The design support device 10 sets a new control value group based on the output result.

Specific operations of the design support system 1 will now be described.

The design support device 10 includes a setter 11, a characteristic value calculator 12, a score calculator 13, a function calculator 14, memory 15, an input part 18, and an output part 19.

The setter 11 sets the control value group and transmits the control value group to the drive circuit 20. When the design support device 10 receives the output result transmitted from the detection circuit 40, the characteristic value calculator 12 calculates, from the output result, a characteristic value that indicates a characteristic of the semiconductor element 30. For example, the output result includes a change of a current over time and a change of a voltage over time. The characteristic value includes at least one selected from the group consisting of a power loss, a switching speed of a current, a switching speed of a voltage, and a switching time. The switching loss at turn-on or turn-off of the semiconductor element 30 and a conduction loss when the semiconductor element 30 is in the on-state may be calculated as the power loss. The switching speed of the current is a change (di/dt) of a current (i) over time (t). The switching speed of the voltage is a change (dV/dt) of a current (V) over time (t). The characteristic value may include a value that is calculated using the at least one selected from the group. For example, the characteristic value may include the magnitudes of the power loss and the switching speed of the voltage in a vector space that includes the power loss and the switching speed of the voltage. The characteristic value calculator 12 transmits the characteristic value to the score calculator 13.

The score calculator 13 calculates a score based on the characteristic value. The score indicates an evaluation of the control value group based on the characteristic value. A high evaluation indicates that a characteristic value that is favorable for a user is obtained using the control value group. The score calculator 13 calculates the score by inputting the characteristic value to an objective function. The objective function is a function for calculating the score from the characteristic value and is preset by the user. For example, the objective function is set to calculate so that the score increases as the characteristic value becomes favorable. The score calculator 13 transmits the score to the function calculator 14. The score calculator 13 associates the calculated score with the characteristic value input to the objective function and the control value group that is the basis of the characteristic value, and stores the result in the memory 15.

The memory 15 stores history data. The history data includes not less than one data set. Each data set includes a combination of the control value group and the score. When a new data set is stored in the memory 15, the function calculator 14 accesses the memory 15 and acquires the history data obtained up to that time. The function calculator 14 calculates a first function from the history data. The first function is used to set a new control value group.

An optimization method is applicable to the calculation of the first function. At least one selected from the group consisting of Bayesian optimization, response surface methodology, and simulated annealing can be used as the optimization method. For example, when response surface methodology is used, a response surface is calculated as the first function. When Bayesian optimization is used, an acquisition function is calculated as the first function. The function calculator 14 transmits the first function to the setter 11. The function calculator 14 stores the first function in the memory 15.

When the setter receives the first function, the setter 11 sets a new control value group. For example, the setter 11 employs the first time difference that is predicted to obtain the best characteristic value in the first function. The setter 11 sets a new control value group that includes the first time difference that is employed.

The design support device 10 executes a first processing that includes the set of the control value group, the calculation of the characteristic value, the calculation of the score, and the calculation of the first function described above. The design support device 10 repeats the first processing. A more desirable control value group is searched thereby.

The input part 18 is used by the user to input data. The user uses the input part 18 to store, in the memory 15, data that is necessary for the processing of the design support device 10.

The output part 19 outputs the data obtained by the processing of the design support device 10 to the user. For example, the output part 19 outputs the best characteristic value obtained by repeating the first processing. The output part 19 may output the control value group at which the best score is obtained. The output part 19 may output the relationship between the characteristic value and the iteration number of the first processing.

The drive circuit 20 includes a pulse generator 21 and a driver 22. The pulse generator 21 generates a pulse signal corresponding to the control value group and transmits the pulse signal to the driver 22. The pulse generator 21 may generate a pulse signal that corresponds to the control value group and other control signals. For example, the pulse generator 21 receives data indicating the first timing transmitted from another electrical circuit. The pulse generator 21 generates a first pulse for applying a voltage to the first gate of the semiconductor element 30 based on the first timing. The pulse generator 21 generates a second pulse for applying a voltage to the second gate of the semiconductor element 30 based on the first timing and the first time difference included in the control value group. The driver 22 is electrically connected with multiple gates. The driver 22 generates an electrical signal corresponding to the pulse signal and transmits the electrical signal to the multiple gates.

For example, the pulse generator 21 includes a pulse generator and a level shifter. The pulse generator 21 may include an integrated circuit. The driver 22 includes an integrated circuit. The functions of the pulse generator 21 and the driver 22 may be realized by one integrated circuit.

For example, the detection circuit 40 is electrically connected with a collector 111 and an emitter 112 of the semiconductor element 30. The detection circuit 40 detects the voltage between the collector 111 and the emitter 112 and the current flowing between the collector 111 and the emitter 112.

Figure 2:
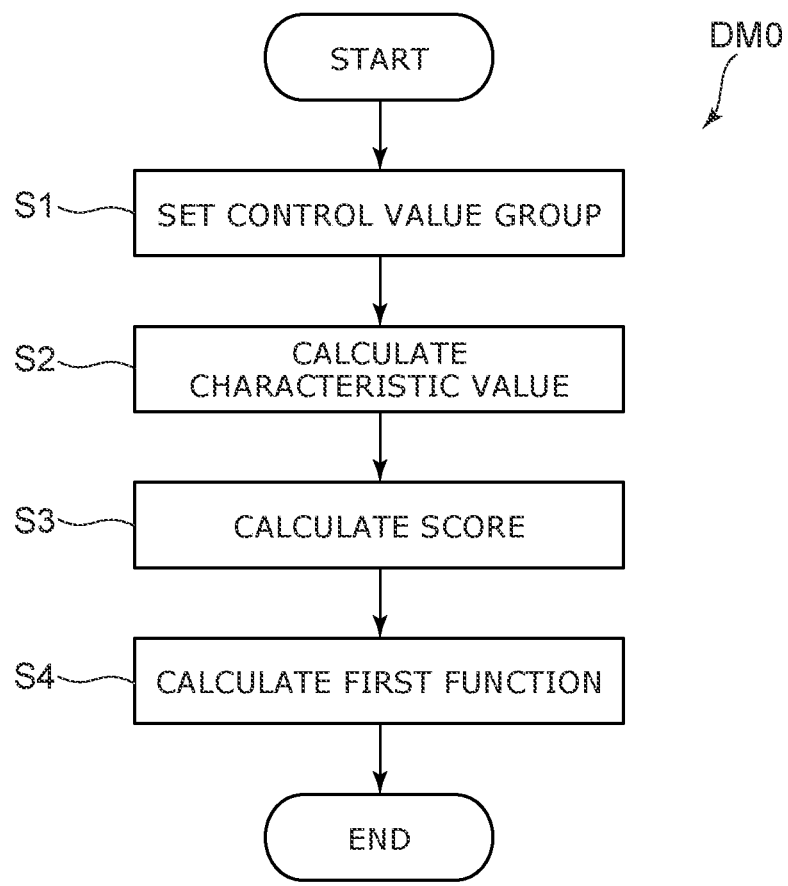
FIG. 2 is a flowchart showing a design support method according to the embodiment.

FIG. 2 is a flowchart showing a design support method according to the embodiment.

For example, the design support device 10 executes the design support method DM0 shown in FIG. 2. The setter 11 sets the control value group (step S1). The characteristic value calculator 12 calculates the characteristic value from the output result of the semiconductor element 30 (step S2). The score calculator 13 calculates the score based on the characteristic value (step S3). The function calculator 14 calculates the first function from the history data (step S4). The design support device 10 repeats steps S1 to S4. Steps S1 to S4 correspond to the first processing.

Figure 3:
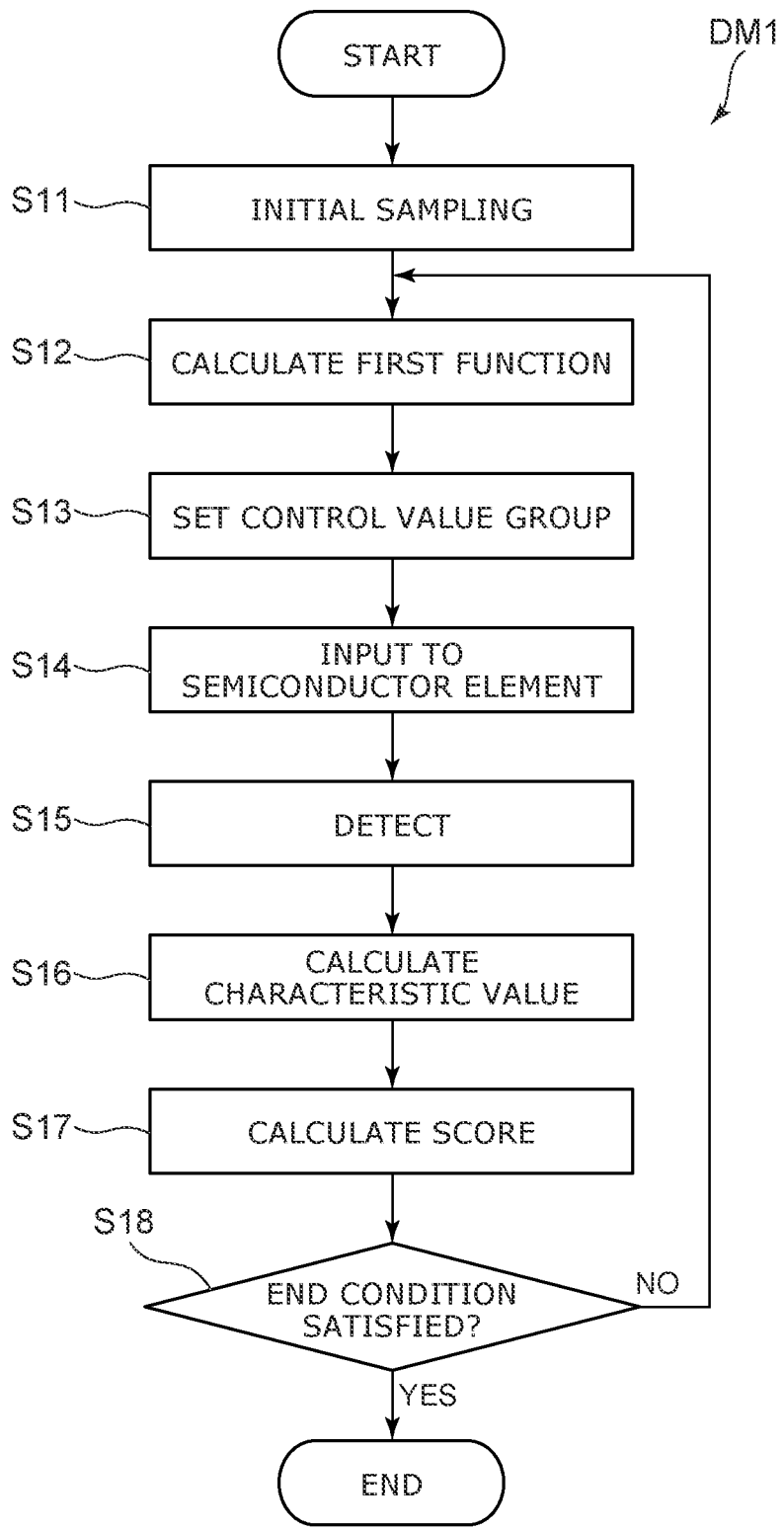
FIG. 3 is a flowchart showing a design support method according to the embodiment.

FIG. 3 is a flowchart showing a design support method according to the embodiment.

For example, the design support system 1 executes a design support method DM1 shown in FIG. 3. Initial sampling is executed (step S11). In the initial sampling, the setter 11 randomly sets the control value group. The characteristic value calculator 12 calculates the characteristic value from the output result. The score calculator 13 calculates the score based on the characteristic value. In the initial sampling, the setting of the control value group, the calculation of the characteristic value, and the calculation of the score are repeated. For example, the initial sampling is repeated 2 to 5 times. By repeating the initial sampling, the data set of the control value group and the score is repeatedly stored in the memory 15.

The function calculator 14 calculates the first function from the multiple data sets stored in the memory 15 (step S12). The setter 11 generates a new control value group based on the first function (step S13). The drive circuit 20 inputs an electrical signal corresponding to the control value group to the semiconductor element 30 (step S14). The detection circuit 40 detects the output from the semiconductor element 30 (step S15). The characteristic value calculator 12 calculates the characteristic value from the output result of the semiconductor element 30 (step S16). The score calculator 13 calculates the score based on the characteristic value (step S17). Steps S13, S16, S17, and S12 correspond to the first processing.

The function calculator 14 determines whether or not the end condition is satisfied (step S18). Steps S12 to S17 are repeated until the end condition is satisfied. As an example, the end condition is set to be when the iteration number of steps S12 to S17 reaches a specified count or when the score reaches a preset target value. By repeating steps S12 to S17, a favorable control value group that relates to the semiconductor element is searched.

FIGS. 4 to 10 are schematic cross-sectional views showing examples of the semiconductor element.

For example, one of the semiconductor element 100 or 100a to 100f shown in FIGS. 4 to 10 can be used as the semiconductor element 30.

Figure 4:
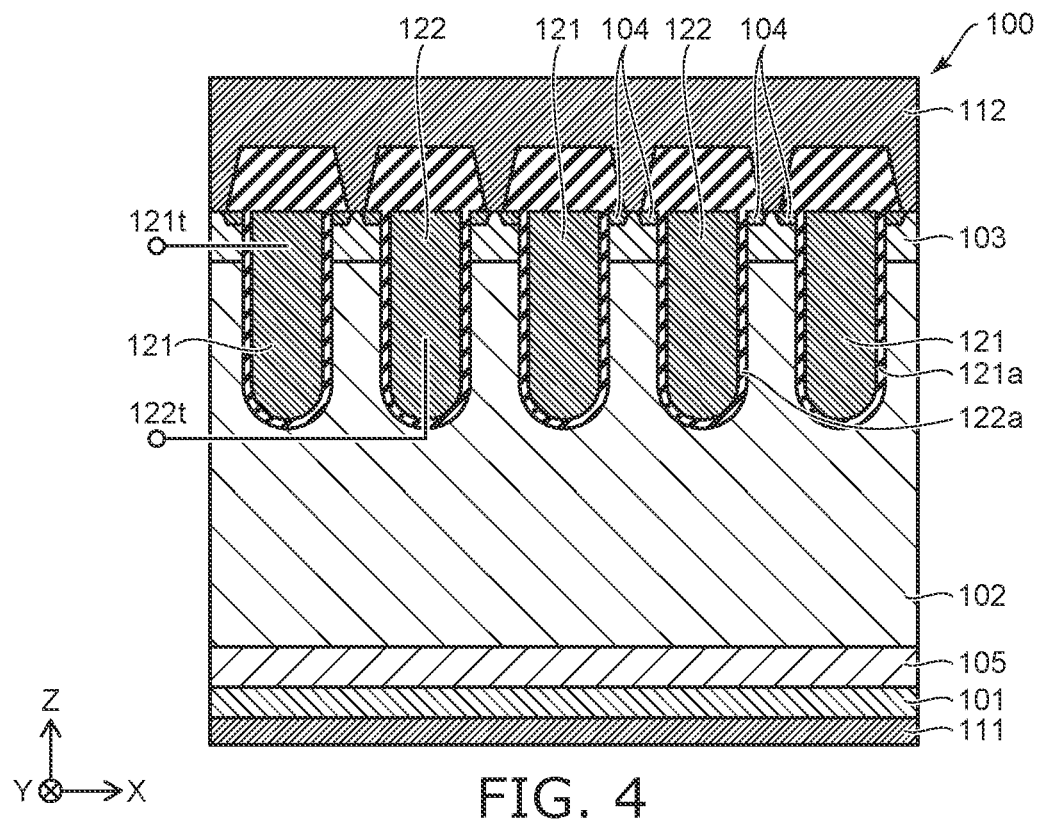
FIG. 4 is a schematic cross-sectional view showing an example of the semiconductor element.

The semiconductor element 100 shown in FIG. 4 includes a first semiconductor region 101, a second semiconductor region 102, a third semiconductor region 103, a fourth semiconductor region 104, a semiconductor region 105, the collector 111, the emitter 112, a first gate 121, a first insulating layer 121a, a second gate 122, and a second insulating layer 122a. The semiconductor element 100 includes an IGBT. The conductivity types of the semiconductor regions described below may be inverted.

The direction from the collector 111 toward the emitter 112 is taken as a Z-direction. The first semiconductor region 101 is located between the collector 111 and the emitter 112 in the Z-direction. The conductivity type of the first semiconductor region 101 is the p-type. The first semiconductor region 101 is electrically connected with the collector 111. The second semiconductor region 102 is located between the first semiconductor region 101 and the emitter 112 in the Z-direction. The conductivity type of the second semiconductor region 102 is the n-type. The third semiconductor region 103 is located between the emitter 112 and a portion of the second semiconductor region 102 in the Z-direction. The conductivity type of the third semiconductor region 103 is the p-type. The fourth semiconductor region 104 is located between the emitter 112 and a portion of the third semiconductor region 103 in the Z-direction. The conductivity type of the fourth semiconductor region 104 is the n-type. The third semiconductor region 103 and the fourth semiconductor region 104 are electrically connected with the emitter 112.

The semiconductor region 105 may be located between the first semiconductor region 101 and the second semiconductor region 102. The conductivity type of the semiconductor region 105 is the n-type. The n-type impurity concentration in the semiconductor region 105 is greater than the n-type impurity concentration in the second semiconductor region 102.

The first gate 121 and the second gate 122 are located between the emitter 112 and another portion of the second semiconductor region 102 in the Z-direction. Multiple first gates 121 are arranged along an X-direction crossing the Z-direction. Multiple second gates 122 are arranged along the X-direction. For example, the X-direction is perpendicular to the Z-direction. In the example shown in FIG. 4, the multiple first gates 121 and the multiple second gates 122 are alternately arranged in the X-direction.

The first insulating layer 121a is located between the second semiconductor region 102 and each first gate 121. The second insulating layer 122a is located between the second semiconductor region 102 and each second gate 122. The first gate 121 and the second gate 122 are electrically isolated from the emitter 112.

A first gate terminal 121t is electrically connected to the first gate 121. A second gate terminal 122t is electrically connected to the second gate 122. The drive circuit 20 is electrically connected with the first and second gate terminals 121t and 122t.

A voltage that is not less than a threshold is applied to one or both of the first and second gates 121 and 122 in a state in which a positive voltage with respect to the emitter 112 is applied to the collector 111. Thereby, a channel (an inversion layer) is formed in the third semiconductor region 103. Electrons pass through the channel and are injected from the emitter 112 into the second semiconductor region 102. When the potential difference between the collector 111 and the second semiconductor region 102 becomes small due to injection of the electrons, holes pass through the first semiconductor region 101 and are injected from the collector 111 into the second semiconductor region 102. Conductivity modulation occurs in the second semiconductor region 102; and the electrical resistance in the second semiconductor region 102 decreases. Thereby, the semiconductor element 100 is switched to the on-state.

Subsequently, when the voltage that is applied to both the first gate 121 and the second gate 122 drops below the threshold, the injection of the electrons from the emitter into the second semiconductor region 102 stops. Thereby, the injection of the holes from the collector 111 into the second semiconductor region 102 also stops. As a result, the semiconductor element 100 is switched in the off-state.

When the semiconductor element 100 is switched from the off-state to the on-state, a switching loss occurs until carriers (electrons and holes) are accumulated in the second semiconductor region 102. Also, when the semiconductor element 100 is switched from the on-state to the off-state, the electrons and the holes that are accumulated in the second semiconductor region 102 are respectively ejected to the collector 111 and the emitter 112. A switching loss occurs until the carriers are ejected from the second semiconductor region 102. The conduction loss is the power loss while the semiconductor element 100 is in the on-state.

Figure 5:
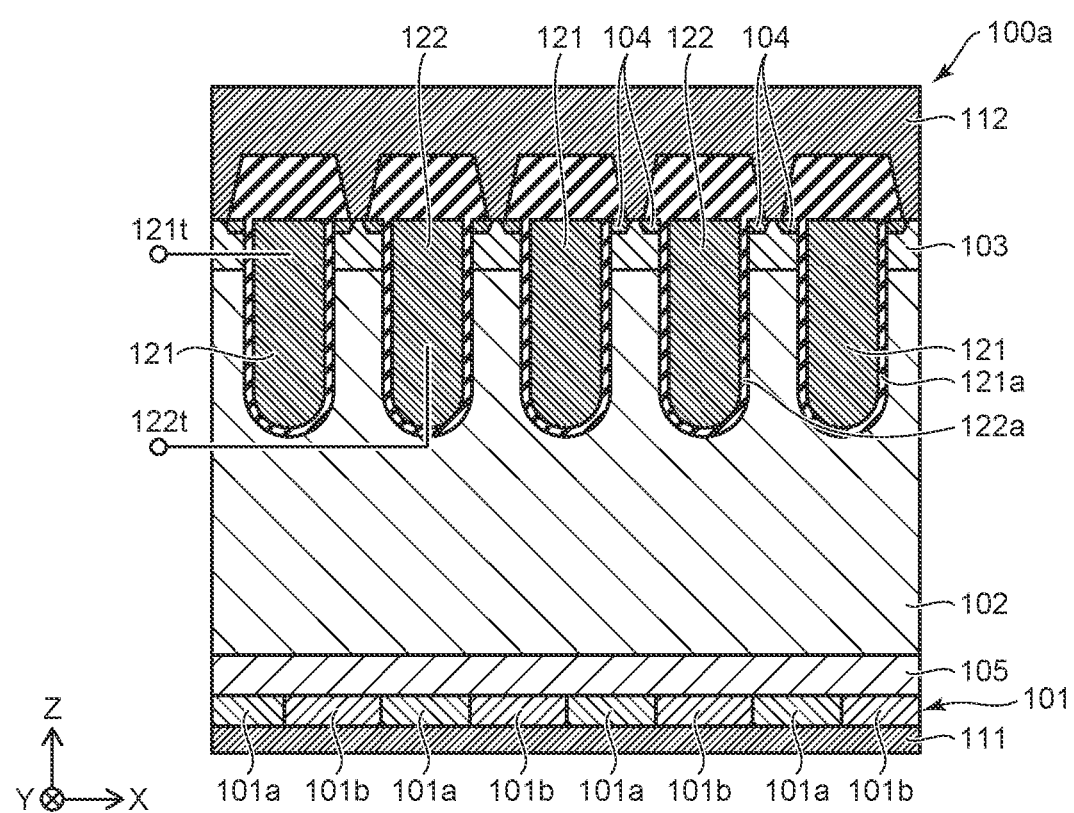
FIG. 5 is a schematic cross-sectional view showing an example of the semiconductor element.

The structure of the first semiconductor region 101 of the semiconductor element 100a shown in FIG. 5 is different from that of the semiconductor element 100. The semiconductor element 100a includes an RC-IGBT.

The first semiconductor region 101 includes a first subregion 101a and a second subregion 101b. The conductivity type of the first subregion 101a is the p-type. The conductivity type of the second subregion 101b is the n-type. In the example shown in FIG. 5, multiple first subregions 101a and multiple second subregions 101b are alternately arranged in the X-direction.

The semiconductor element 100a includes an IGBT that includes the first subregion 101a, the second semiconductor region 102, the third semiconductor region 103, the fourth semiconductor region 104, the first gate 121, and the second gate 122. The semiconductor element 100a includes a diode that includes the second subregion 101b, the second semiconductor region 102, and the third semiconductor region 103.

When a positive voltage with respect to the collector 111 is applied to the emitter 112 by an induced electromotive force, etc., the diode of the semiconductor element 100a operates. A current flows from the third semiconductor region 103 toward the second semiconductor region 102 and the second subregion 101b.

Figure 6:
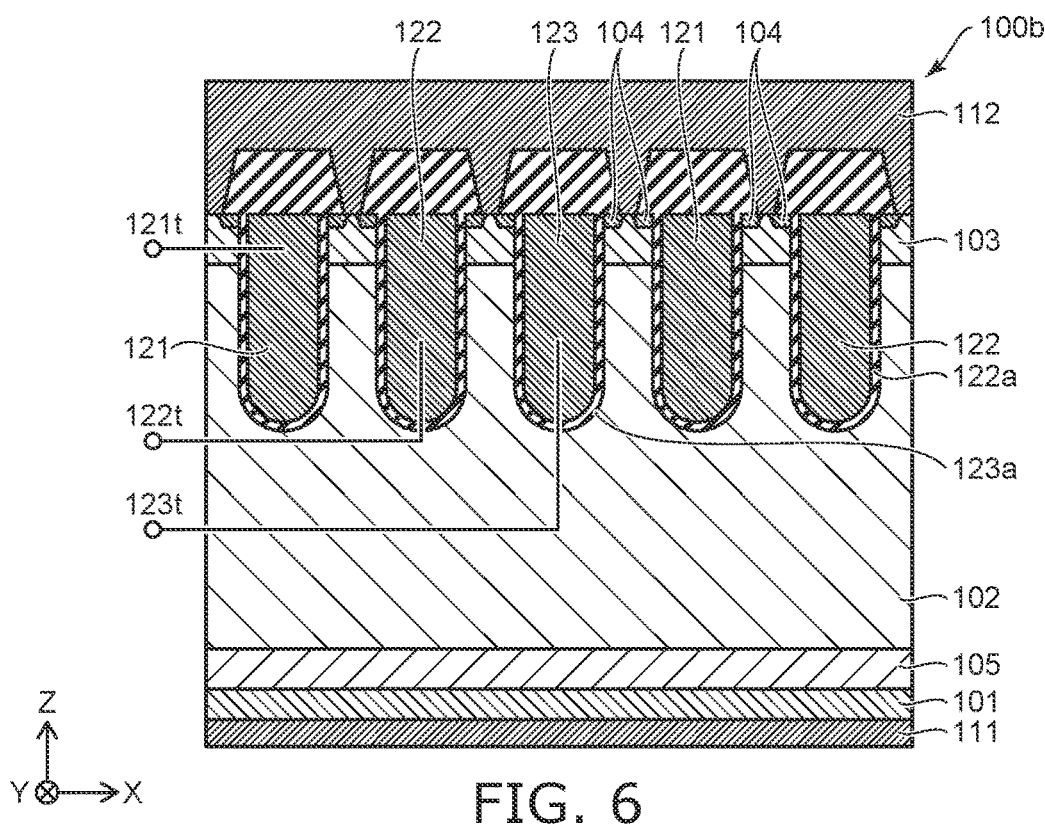
FIG. 6 is a schematic cross-sectional view showing an example of the semiconductor element.

The semiconductor element 100b shown in FIG. 6 further includes a third gate 123. The third gate 123 is located between the second semiconductor region 102 and the emitter 112 in the Z-direction. Multiple third gates 123 are arranged along the X-direction. In the example shown in FIG. 6, one first gate 121, one second gate 122, and one third gate 123 are alternately arranged in the X-direction.

A third insulating layer 123a is located between the second semiconductor region 102 and each third gate 123. The third gate 123 is electrically isolated from the emitter 112. The third gate 123 is electrically connected to a third gate terminal 123t. The drive circuit 20 is electrically connected with the third gate terminal 123t.

Figure 7:
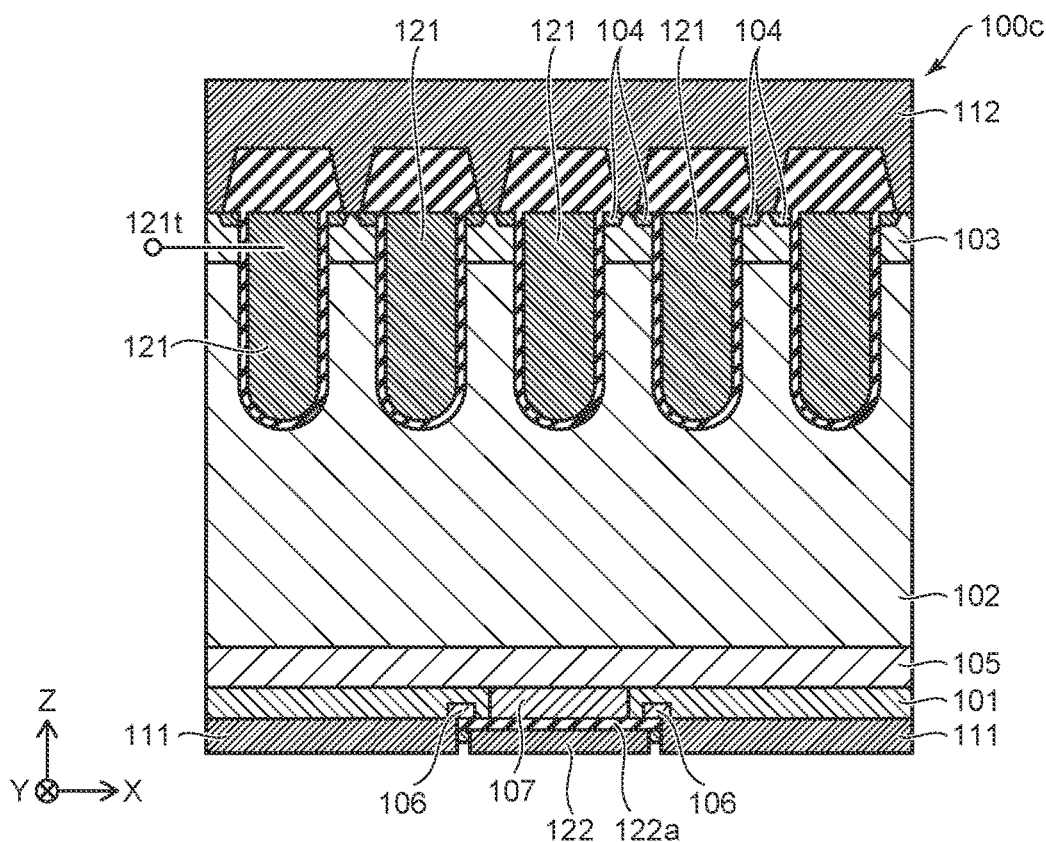
FIG. 7 is a schematic cross-sectional view showing an example of the semiconductor element.

The semiconductor element 100c shown in FIG. 7 includes the first semiconductor region 101, the second semiconductor region 102, the third semiconductor region 103, the fourth semiconductor region 104, the semiconductor regions 105 to 107, the collector 111, the emitter 112, the first gate 121, the first insulating layer 121a, the second gate 122, and the second insulating layer 122a.

The direction from the collector 111 toward the second gate 122 is along the X-direction. The second gate 122 is separated from the collector 111 and is electrically isolated from the collector 111. The first semiconductor region 101 is located between the collector 111 and the emitter 112 in the Z-direction. A semiconductor region 107 is located between the second gate 122 and the emitter 112 in the Z-direction. The direction from the first semiconductor region 101 toward the semiconductor region 107 is along the X-direction. The conductivity types of semiconductor regions 106 and 107 are the n-type.

The semiconductor region 106 is separated from the semiconductor region 107 in the X-direction. The direction from a portion of the collector 111 toward the semiconductor region 106 is along the Z-direction. The direction from a portion of the second gate 122 toward the semiconductor region 106 is along the Z-direction. The second insulating layer 122a is located between the second gate 122 and the first semiconductor region 101, between the second gate 122 and the semiconductor region 106, and between the second gate 122 and the semiconductor region 107.

In the Z-direction, the second semiconductor region 102 is located between the first semiconductor region 101 and the emitter 112 and between the semiconductor region 107 and the emitter 112. The third semiconductor region 103 is located between the emitter 112 and a portion of the second semiconductor region 102 in the Z-direction. The fourth semiconductor region 104 is located between the emitter 112 and a portion of the third semiconductor region 103 in the Z-direction.

The first gate 121 is located between the emitter 112 and another portion of the second semiconductor region 102 in the Z-direction. The multiple first gates 121 are arranged along the X-direction crossing the Z-direction.

A voltage that is not less than a threshold is applied to the first gate 121 in a state in which a positive voltage with respect to the emitter 112 is applied to the collector 111. As a result, the semiconductor element 100c is switched to the on-state. When the voltage applied to the first gate 121 is greater than the threshold, a voltage that is not less than the threshold is applied to the second gate 122. A channel is formed in the semiconductor region 107; and electrons pass through the channel and are ejected from the second semiconductor region 102 into the collector 111. When the voltage applied to the first gate 121 decreases to be less than the threshold in the state in which the voltage that is not less than the threshold is applied to the second gate 122, the ejection of the electrons from the second semiconductor region 102 can be faster. The turn-off switching loss can be reduced thereby.

Figure 8:
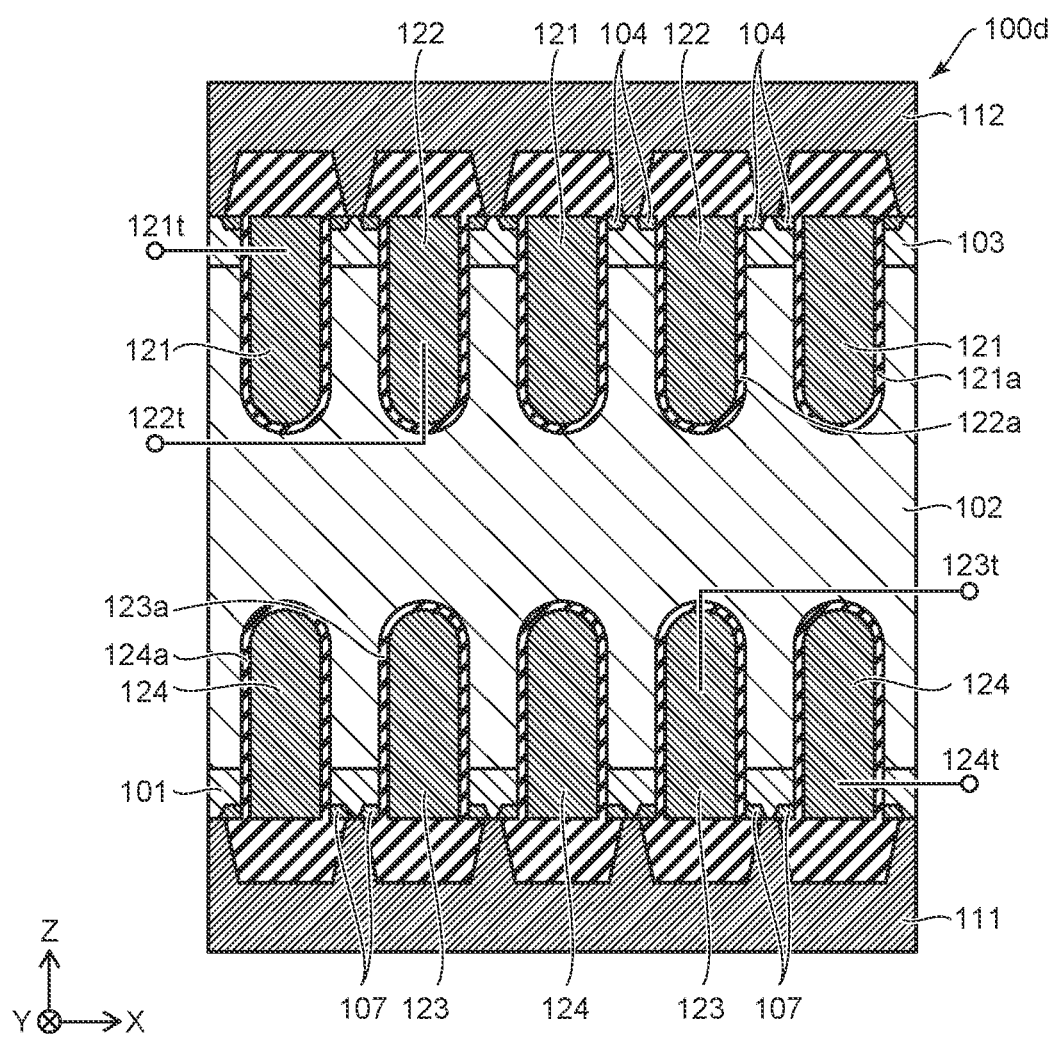
FIG. 8 is a schematic cross-sectional view showing an example of the semiconductor element.

Compared to the semiconductor element 100, the semiconductor element 100d shown in FIG. 8 further includes the semiconductor region 107, the third gate 123, the third insulating layer 123a, a fourth gate 124, and a fourth insulating layer 124a.

The first semiconductor region 101, the third gate 123, and the fourth gate 124 are located between the collector 111 and the second semiconductor region 102 in the Z-direction. The third gate terminal 123t is electrically connected to the third gate 123. A fourth gate terminal 124t is electrically connected to the fourth gate 124. The drive circuit 20 is electrically connected with the third and fourth gate terminals 123t and 124t. The multiple third gates 123 are arranged along the X-direction. The multiple fourth gates 124 are arranged along the X-direction. In the example shown in FIG. 8, the multiple third gates 123 and the multiple fourth gates 124 are alternately arranged in the X-direction.

The third insulating layer 123a is located between the second semiconductor region 102 and each third gate 123. The fourth insulating layer 124a is located between the second semiconductor region 102 and each fourth gate 124. The third gate 123 and the fourth gate 124 are electrically isolated from the collector 111.

The first semiconductor region 101 and the semiconductor region 107 are located between the third gate 123 and the fourth gate 124 next to each other in the X-direction. The conductivity type of the semiconductor region 107 is the n-type. Multiple semiconductor regions 107 that are separated from each other may be located between the third gate 123 and the fourth gate 124 next to each other in the X-direction. The semiconductor region 107 is located between the collector 111 and a portion of the first semiconductor region 101 in the Z-direction.

A voltage that is not less than a threshold is applied to the first gate 121 in a state in which a positive voltage with respect to the emitter 112 is applied to the collector 111. Thereby, electrons are injected from the emitter 112 into the second semiconductor region 102. Also, a voltage that is not less than a threshold is applied to the second gate 122. Thereby, holes are injected from the collector 111 into the second semiconductor region 102. The semiconductor element 100d is switched to the on-state by injection of the electrons and the holes into the second semiconductor region 102.

A voltage that is not less than the threshold is applied to the second gate 122 before turning off the semiconductor element 100d. Thereby, the holes at the emitter 112 side of the second semiconductor region 102 are ejected into the emitter 112. Also, a voltage that is not less than a threshold is applied to the fourth gate 124. Thereby, the electrons at the collector 111 side of the second semiconductor region 102 are ejected into the collector 111. The turn-off switching loss can be reduced by ejecting the carriers accumulated in the second semiconductor region 102 before turn-off.

Figure 9:
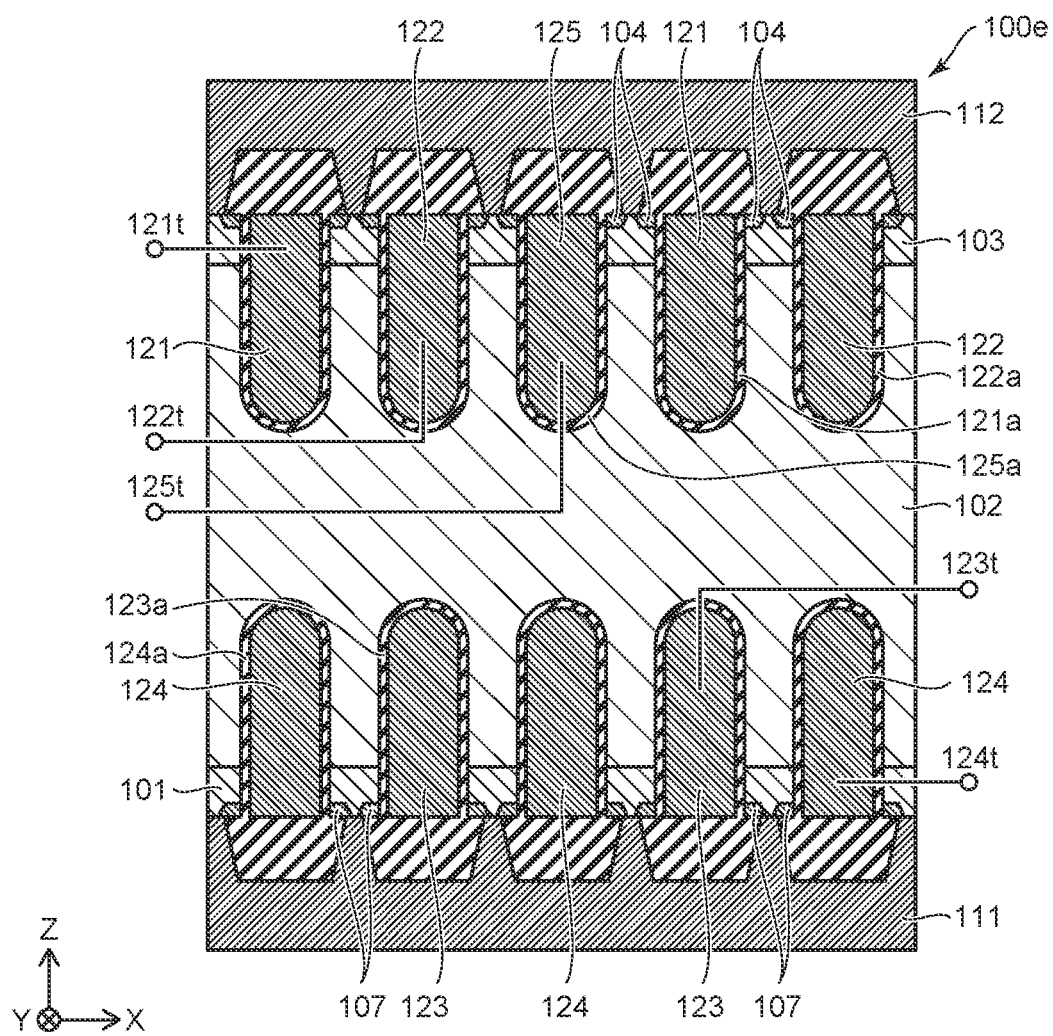
FIG. 9 is a schematic cross-sectional view showing an example of the semiconductor element.

Compared to the semiconductor element 100d, the semiconductor element 100e shown in FIG. 9 further includes a fifth gate 125. The first gate 121, the second gate 122, and the fifth gate 125 are located between the second semiconductor region 102 and the emitter 112 in the Z-direction. A fifth insulating layer 125a is located between the fifth gate 125 and the second semiconductor region 102. A fifth gate terminal 125t is electrically connected to the fifth gate 125. The drive circuit 20 is electrically connected with the first and second gate terminals 121t and 122t. In the example shown in FIG. 9, one first gate 121, one second gate 122, and one fifth gate 125 are alternately arranged in the X-direction.

The operations of the first to fourth gates 121 to 124 are similar to those of the semiconductor element 100d. In the semiconductor element 100e, a voltage that is not less than a threshold is applied to the fifth gate 125 at turn-on. Injection of the electrons into the second semiconductor region 102 is promoted thereby, and the switching loss at turn-on is reduced.

Also, the voltage applied to the fifth gate 125 is less than the threshold when the semiconductor element 100e is in the on-state. The ejection of the holes from the second semiconductor region 102 into the emitter 112 can be suppressed, and the carrier density in the second semiconductor region 102 can be increased. The conduction loss of the semiconductor element 100e can be reduced thereby.

Figure 10:
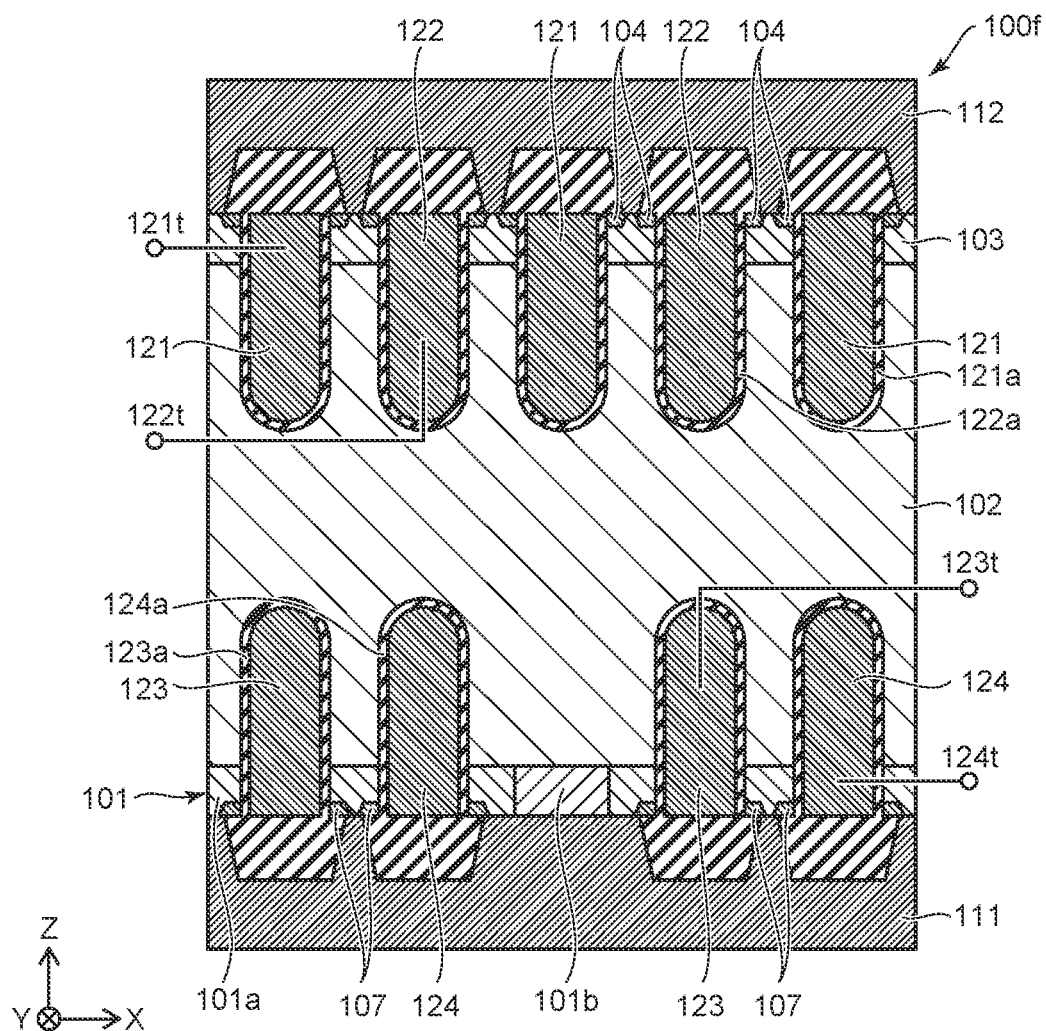
FIG. 10 is a schematic cross-sectional view showing an example of the semiconductor element.

The semiconductor element 100f shown in FIG. 10 differs from the semiconductor element 100d in that the first semiconductor region 101 includes the first subregion 101a and the second subregion 101b. The semiconductor element 100f includes an RC-IGBT.

The operation of the semiconductor element 100f as an IGBT is similar to that of the semiconductor element 100d. When the semiconductor element 100f operates as a diode, a voltage that is not less than the threshold is applied to at least one of the first gate 121 or the second gate 122 before the end of the diode operation. The ejection of the electrons into the emitter 112 is promoted thereby. Also, a voltage that is not less than the threshold is applied to at least one of the third gate 123 or the fourth gate 124. The ejection of the holes into the collector 111 is promoted thereby. As a result, the recovery loss in the diode operation is reduced.

When the semiconductor element 100b is used, the control value group may further include a second time difference between a first timing at which the voltage is applied to the first gate and the third timing at which the voltage is applied to the third gate. The control value group may include at least one selected from the group consisting of a third voltage value applied to the third gate 123 and a third electrical resistance of the third gate 123.

When the semiconductor element 100d is used, the control value group may further include the second time difference. The control value group may further include a third time difference between the first timing at which the voltage is applied to the first gate and a fourth timing at which a voltage is applied to the fourth gate. The control value group may include at least one selected from the group consisting of the third voltage value applied to the third gate 123, the third electrical resistance of the third gate 123, a fourth voltage value applied to the fourth gate 124, and a fourth electrical resistance of the fourth gate 124.

Figure 11:
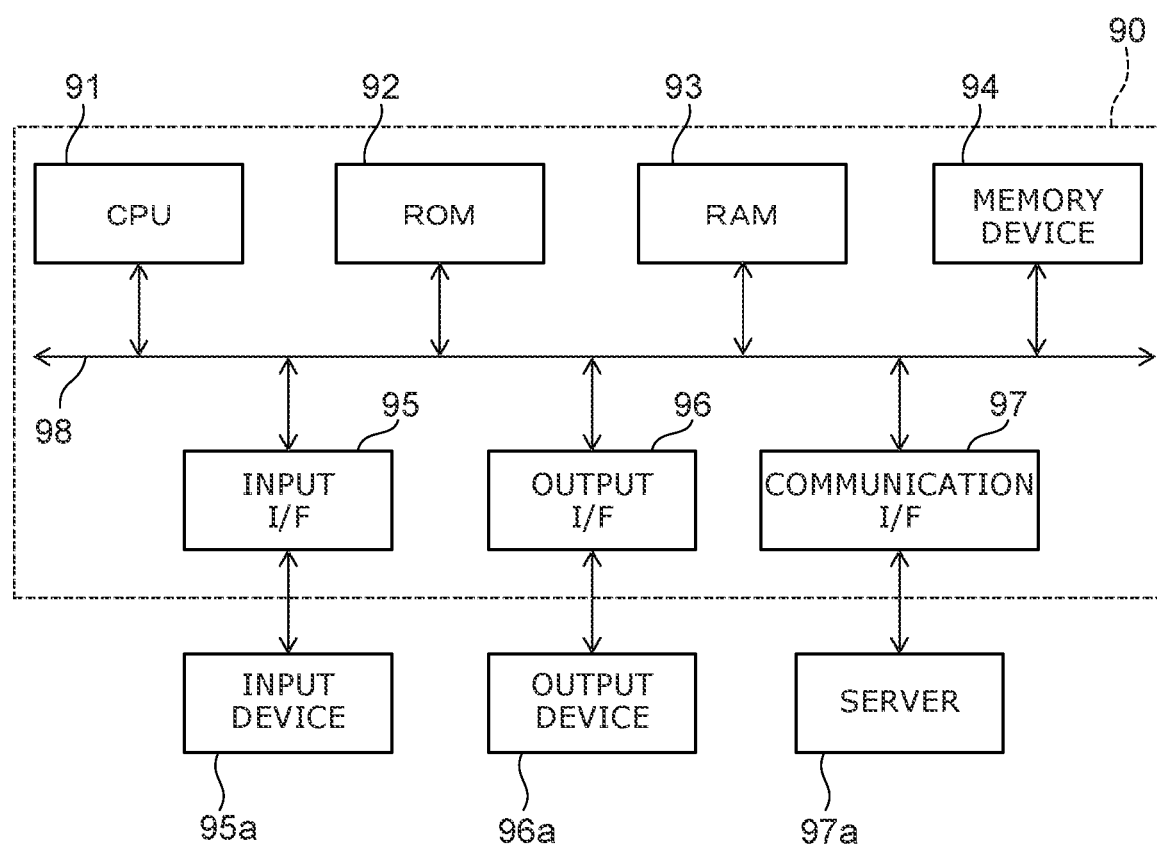
FIG. 11 is a schematic view illustrating a hardware configuration.

FIG. 11 is a schematic view illustrating a hardware configuration.

The design support device 10 according to the embodiment can be realized by the hardware configuration shown in FIG. 11. A processing device 90 shown in FIG. 11 includes a CPU 91, ROM 92, RAM 93, a memory device 94, an input interface 95, an output interface 96, and a communication interface 97.

The ROM 92 stores programs that control the operations of a computer. A program that is necessary for causing the computer to realize the processing described above is stored in the ROM 92. The RAM 93 functions as a memory region into which the programs stored in the ROM 92 are loaded.

The CPU 91 includes a processing circuit. The CPU 91 uses the RAM 93 as work memory to execute the programs stored in at least one of the ROM 92 or the memory device 94. While executing the program, the CPU 91 executes various processing by controlling configurations via a system bus 98.

The memory device 94 stores data necessary for executing the programs and data obtained by executing the programs.

The input interface (I/F) 95 connects the processing device 90 and an input device 95a. The input I/F 95 is, for example, a serial bus interface such as USB, etc. The CPU 91 can read various data from the input device 95a via the input I/F 95.

An output interface (I/F) 96 connects the processing device 90 and an output device 96a. The output I/F 96 is, for example, an image output interface such as Digital Visual Interface (DVI), High-Definition Multimedia Interface (HDMI (registered trademark)), etc. The CPU 91 transmits the data to the output device 96a via the output I/F 96. The output device 96a outputs the data.

A communication interface (I/F) 97 connects the processing device 90 and a server 97a that is outside the processing device 90. The communication I/F 97 is, for example, a network card such as a LAN card, etc. The CPU 91 can read various data from the server 97a via the communication I/F 97.

The memory device 94 includes not less than one selected from a hard disk drive (HDD) and a solid state drive (SSD). The input device 95a includes not less than one selected from a mouse, a keyboard, a microphone (audio input), and a touchpad. The output device 96a includes not less than one selected from a monitor, a printer, a speaker, and a projector. A device such as a touch panel that functions as both the input device 95a and the output device 96a may be used.

The processing device 90 functions as the setter 11, the characteristic value calculator 12, the score calculator 13, and the function calculator 14. The functions of the setter 11, the characteristic value calculator 12, the score calculator 13, and the function calculator 14 may be realized by the collaboration of multiple processing devices. When realizing the functions of the setter 11, the characteristic value calculator 12, the score calculator 13, and the function calculator 14, a portion of the processing device and another processing device may be connected to each other via a network. For example, a portion of the functions of the setter 11, the characteristic value calculator 12, the score calculator 13, and the function calculator 14 may be provided by a cloud server.

The memory device 94 functions as the memory 15. The input device 95a functions as the input part 18. The output device 96a functions as the output part 19.

Advantages of the embodiment will now be described. For a semiconductor element that includes multiple gates, there is a method in which the timing of applying the voltage to the gate is shifted between the gates. The characteristics of the semiconductor element can be improved thereby. For example, the power loss can be reduced. To effectively improve the characteristics, it is desirable to set the time difference of the voltage application between the gates according to the structure of the semiconductor element. Conventionally, a human searches the time difference by confirming the characteristics of the semiconductor element while changing the time difference.

According to the embodiment, the control value group that includes the first time difference is set using the first function that is calculated from the history data. For example, a better control value group can be efficiently searched compared to when the human sets the control value group based on experience, intuition, etc. According to the design support device 10 according to the embodiment, the control value group is automatically searched. The search of the control value group by the human is unnecessary, and the design efficiency can be increased.

It is favorable for the first function to be calculated by Bayesian inference. For example, in step S12 of the design support method DM1 shown in FIG. 3, the function calculator 14 estimates a surrogate model of the score from the history data. The function calculator 14 calculates an acquisition function as the first function from the surrogate model of the score. The setter 11 sets a new control value group by using the acquisition function.

According to Bayesian inference, compared to response surface methodology, the likelihood of obtaining a favorable control value group with less processing time is high. Or, according to Bayesian inference, compared to response surface methodology, the likelihood of searching a more desirable control value group can be improved. A more desirable control value group means a control value group for which a better characteristic value is obtained.

The control value group that is set using the first function may include at least one selected from the group consisting of the first voltage value applied to the first gate 121, the second voltage value applied to the second gate 122, the first electrical resistance of the first gate 121, and the second electrical resistance of the second gate 122 instead of the first time difference. In addition to the first time difference, the control value group may include the at least one selected from the group.

For example, the first gate 121 and the second gate 122 each include gate resistances that are connected in series with an electrode portion located in the second semiconductor region 102. A first gate resistance and a second gate resistance include variable resistances. The first gate resistance of the first and second gates 121 and resistance of the second gate 122 can be adjusted independently.

A more desirable value can be obtained by searching for at least one control value selected from the group. For example, a control value that has a smaller power consumption can be obtained by the search.

First Modification

Figure 12:
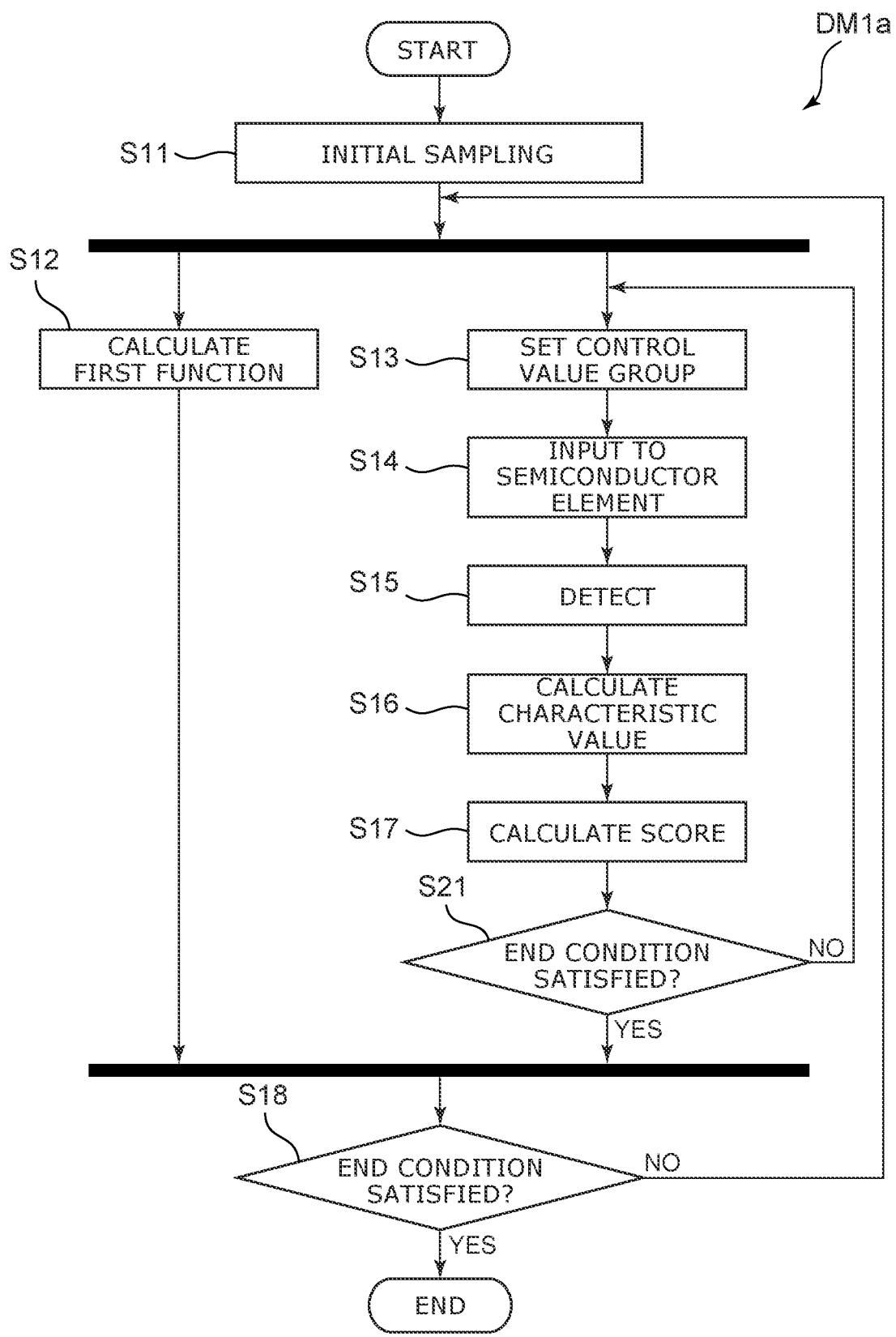
FIG. 12 is a flowchart showing a design support method according to a first modification of the embodiment.

FIG. 12 is a flowchart showing a design support method according to a first modification of the embodiment.

The design support device 10 may execute a second sub-processing while executing a first sub-processing. The first sub-processing includes step S12. The second sub-processing includes steps S13 to S17 of the flowchart shown in FIG. 3. In other words, the first and second sub-processing are executed in one first processing.

In the design support method DM1a according to the first modification of shown in FIG. 12, initial sampling is executed (step S11). The function calculator 14 calculates the first function (step S12). The setter 11 sets the control value group while calculating the first function (step S13). The drive circuit 20 inputs an electrical signal to the semiconductor element 30 (step S14). The detection circuit 40 detects the output from the semiconductor element 30 (step S15). The characteristic value calculator 12 calculates a characteristic value (step S16). The score calculator 13 calculates a score (step S17). The control value group is randomly set while executing step S12 for the first time.

After step S17, the setter 11 determines whether or not the end condition of the second sub-processing is satisfied (step S21). The completion of the calculation of the first function is set as the end condition. The iteration number of steps S12 to S17 reaching a specified count may be set as the end condition.

After determining that step S12 has completed and the end condition is satisfied in step S21, the setter 11 determines whether or not the end condition of repeating the first and second sub-processing is satisfied (step S18). When the end condition is not satisfied, steps S12 and S13 are re-performed. At this time, the control value group is set in step S13 by using the first function obtained by step S12 directly before.

The time that is necessary to calculate the first function is long compared to the detection of the output from the semiconductor element 30, the calculation of the characteristic value, the calculation of the score, etc. By executing the second sub-processing while executing the first sub-processing, the processing time that is necessary to search the control value group can be reduced. The time of one first processing can be reduced by stopping the repetition of the second sub-processing according to the completion of the first sub-processing. According to the design support method DM1a, compared to the design support method DM1, the execution count of the second sub-processing can be increased for the same amount of time. The likelihood of searching a favorable control value group more quickly can be improved.

Second Modification

Figure 13:
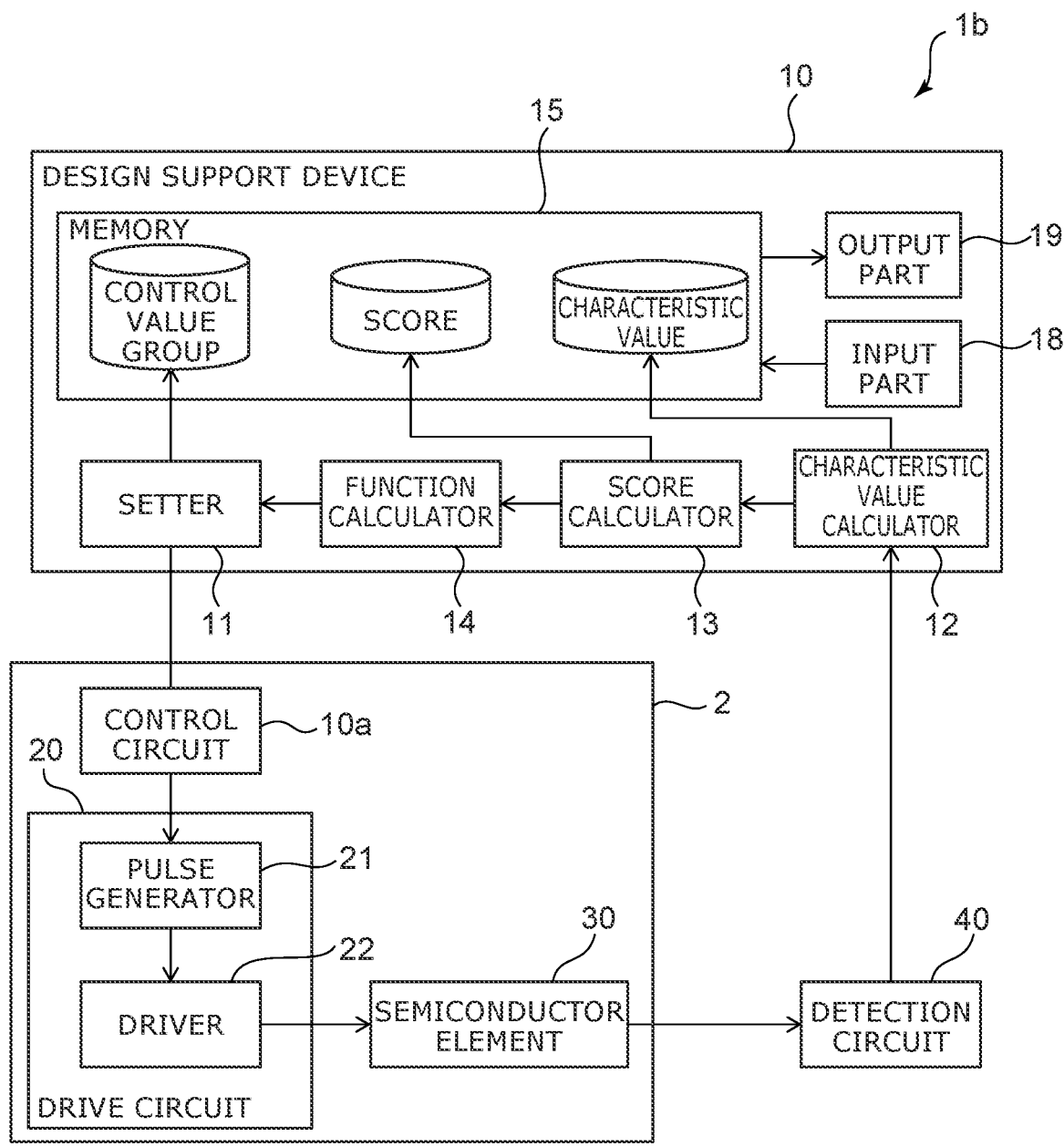
FIG. 13 is a block diagram showing a functional configuration of a design support system according to a second modification of the embodiment.

FIG. 13 is a block diagram showing a functional configuration of a design support system according to a second modification of the embodiment.

As shown in FIG. 13, the design support system 1b according to the second modification includes an electrical device 2, the design support device 10, and the detection circuit 40. The electrical device 2 includes a control circuit 10a, the drive circuit 20, and the semiconductor element 30.

The setter 11 transmits the control value group that is set to the control circuit 10a. The control circuit 10a controls the drive circuit 20 so that the electrical signal that corresponds to the control value group is transmitted to the semiconductor element 30.

The control circuit 10a includes memory. The control value group that is obtained by the search is stored in the memory. For example, in the design support system 1b according to the second modification, the search of the control value group is executed before embedding the electrical device 2 in another product. After the electrical device 2 is embedded in another product, the control circuit 10a operates the drive circuit 20 based on the control value group stored in the memory.

According to the second modification, the electrical device 2 can be provided in which more desirable characteristics are realized.

Third Modification

Figure 14:
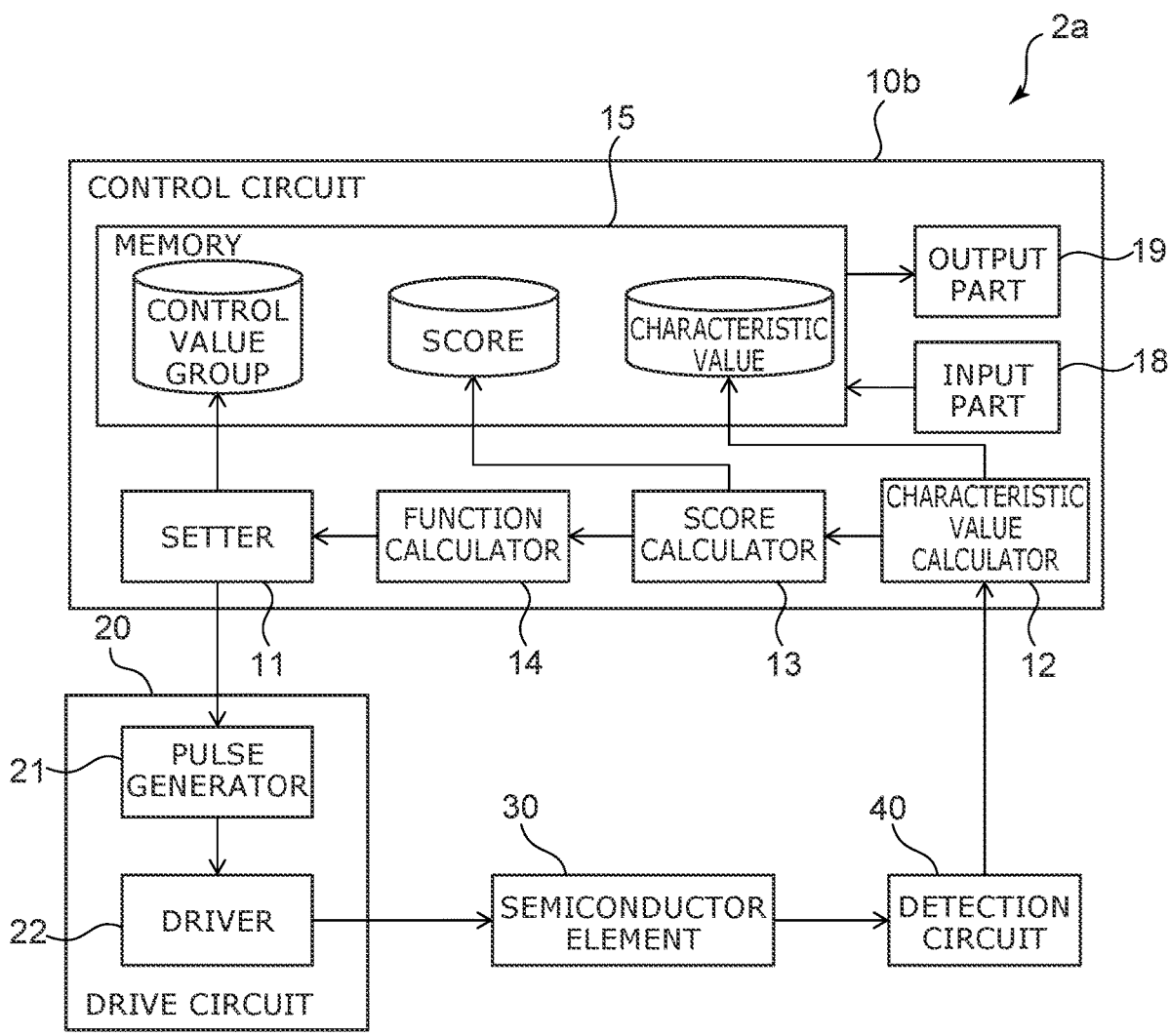
FIG. 14 is a block diagram showing a functional configuration of an electrical device according to a third modification of the embodiment.

FIG. 14 is a block diagram showing a functional configuration of an electrical device according to a third modification of the embodiment. As shown in FIG. 14, the electrical device 2a according to the third modification includes a control circuit 10b, the drive circuit 20, the semiconductor element 30, and the detection circuit 40.

The control circuit 10b functions as the design support device 10 of the design support system 1. The control circuit 10b sets the control value group. The control circuit 10b controls the drive circuit 20 so that an electrical signal that corresponds to the control value group is transmitted to the semiconductor element 30. For example, the electrical device 2a according to the third modification searches the control value group after being embedded in another product.

For example, the electrical device 2a executes the design support method DM1 shown in FIG. 3. The electrical device 2a calculates the first function, sets a new control value group, etc., each time the output result is obtained from the semiconductor element 30. Thereby, it is possible to improve the control value group in real time when operating the electrical device 2a.

Figure 15:
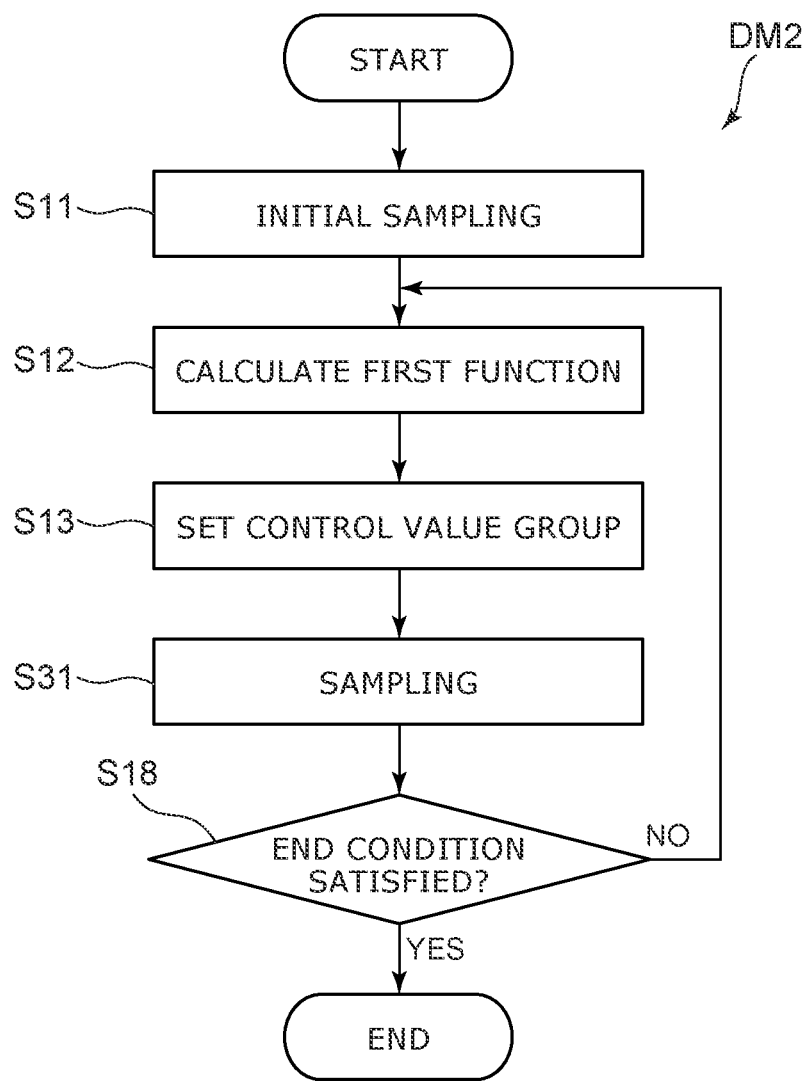
FIG. 15 is a flowchart showing another operation of the electrical device according to the third modification of the embodiment.

FIG. 15 is a flowchart showing another operation of the electrical device according to the third modification of the embodiment.

The electrical device 2a may execute a design support method DM2 shown in FIG. 15. In the design support method DM2, initial sampling is executed (step S11). The function calculator 14 calculates the first function (step S12). The setter 11 sets the control value group based on the calculated first function (step S13). The electrical device 2a performs sampling by using the control value group that is set (step S31). In the sampling, the input to the semiconductor element 30, the detection, the calculation of the characteristic value, and the calculation of the score are repeated. The data set of the control value group and the score is repeatedly stored in the memory 15.

The electrical device 2a stores the data sets until the end condition is satisfied. For example, the end condition is when the operation time of the electrical device 2a has elapsed. When the end condition is satisfied, the function calculator 14 calculates the first function from the history data.

For example, according to the design support method DM2, in the operation time frame of the electrical device 2a, the data set is stored, and the design value group is not modified. The design value group is modified in the non-operating time frame of the electrical device 2a. According to the design support method DM2, for example, the operations of the electrical device 2a can be more stable.

Fourth Modification

Figure 16:
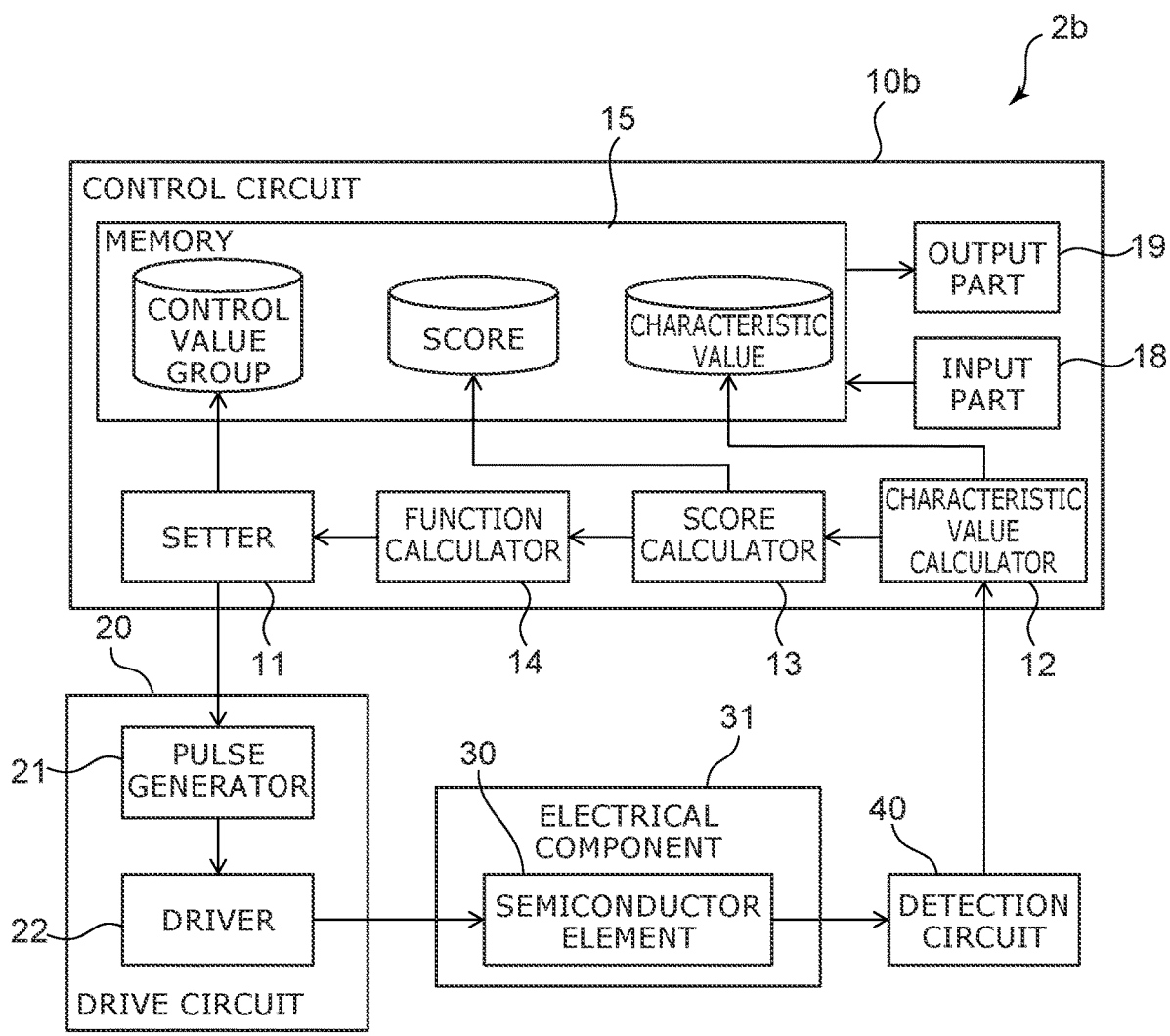
FIG. 16 is a block diagram showing a functional configuration of an electrical device according to a fourth modification of the embodiment.

FIG. 16 is a block diagram showing a functional configuration of an electrical device according to a fourth modification of the embodiment.

The electrical device 2b according to the fourth modification differs from the electrical device 2a in that the electrical device 2b includes an electrical component 31. The electrical component 31 includes the semiconductor element 30. The electrical component 31 is, for example, a motor.

The detection circuit 40 detects the output of the electrical component 31. The characteristic value calculator 12 calculates a characteristic value that indicates a characteristic of the electrical component 31 from the output result. When the electrical component 31 is a motor, the detection circuit 40 detects the value of the current flowing through the motor. In such a case, the detection circuit 40 includes, for example, a current detection resistor (a shunt resistance). Or, the detection circuit 40 may detect the position (the angle) of the motor. In such a case, the detection circuit 40 includes a rotation angle sensor (e.g., a Hall sensor or a resolver). The characteristic value calculator 12 calculates a characteristic value that indicates a characteristic of the electrical component 31 from the output result. In each case, the characteristic value is, for example, the rotational speed of the motor.

According to the design support system 1, the operating condition of the semiconductor element 30 when searching the control value group may be different from the operating condition when the semiconductor element 30 is actually used. In other words, the characteristic that is obtained when searching may be different from the characteristic that is obtained when actually using the semiconductor element 30. According to the third modification, the control value group can be set based on the output when actually using the semiconductor element 30. Therefore, the characteristic that is obtained when actually using the semiconductor element 30 can be set to a more desirable value.

The processing of the various data described above may be recorded, as a program that can be executed by a computer, in a magnetic disk (a flexible disk, a hard disk, etc.), an optical disk (CD-ROM, CD-R, CD-RW, DVD-ROM, DVD±R, DVD±RW, etc.), semiconductor memory, or another recording medium (non-transitory computer-readable storage medium) that can read by a nontemporary computer.

For example, information that is recorded in the recording medium can be read by a computer (or an embedded system). The recording format (the storage format) of the recording medium is arbitrary. For example, the computer reads the program from the recording medium and causes the CPU to execute the instructions recited in the program based on the program. In the computer, the acquisition (or the reading) of the program may be performed via a network.

Embodiments may include the following features.

Feature 1

A storage medium storing a program, the program causing a processing device to execute a first processing, the first processing including:

setting a control value group for a semiconductor element, the semiconductor element including a plurality of gates, the plurality of gates including a first gate and a second gate, the control value group including a first time difference between a first timing and a second timing, a voltage being applied to the first gate at the first timing, a voltage being applied to the second gate at the second timing;

calculating a characteristic value from an output result when an electrical signal corresponding to the control value group is input to the semiconductor element, the characteristic value indicating a characteristic of the semiconductor element; and calculating a first function from history data including not less than one data set, the data set being the control value group and a score based on the characteristic value, the program causing the processing device to set a new control value group by using the first function.

Feature 2

The storage medium according to Feature 1, wherein the processing device is caused to repeatedly execute the first processing.

Feature 3

The storage medium according to Feature 2, wherein one of the first processes includes:

a first sub-processing that includes the calculating of the first function; and a second sub-processing that includes the setting of the control value group and the calculating of the characteristic value, and the processing device is caused to execute the second sub-processing while executing the first sub-processing.

Feature 4

The storage medium according to Feature 3, wherein
the processing device is caused to repeat the second sub-processing while executing the first sub-processing in the one of the first processes, and
the processing device is caused to stop the repetition of the second sub-processing according to a completion of the first sub-processing in the one of the first processes.

According to embodiments described above, a design support device, a design support system, an electrical device, a design support method, a program, and a storage medium can be provided in which the control value group can be more efficiently searched.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components such as design support devices, control circuits, drive circuits, semiconductor elements, detection circuits, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all design support devices, design support system, electrical devices, design support methods, programs, and storage mediums practicable by an appropriate design modification by one skilled in the art based on the design support devices, the design support systems, the electrical devices, the design support methods, the programs, and the storage mediums described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A design support device, comprising:
a processing circuit; and
a memory storing instructions that, when executed by the processing circuit, enable the processing circuit to execute a first processing,
the first processing including
setting a control value group for a semiconductor element, the semiconductor element including a plurality of gates, the plurality of gates including a first gate and a second gate, the control value group including a first time difference between a first timing at which a voltage is applied to the first gate and a second timing at which a voltage is applied to the second gate,
calculating a characteristic value from an output result when an electrical signal corresponding to the control value group is input to the semiconductor element, the characteristic value indicating a characteristic of the semiconductor element, and
calculating a first function from history data including not less than one data set, the data set including the control value group and a score based on the characteristic value, the processing circuit setting a new control value group by using the first function,
wherein
the first processing is repeatedly executed, and
one of the repeated executions of the first processing includes:
a first sub-processing that includes the calculating of the first function; and
a second sub-processing that includes the setting of the control value group and the calculating of the characteristic value, and
the second sub-processing is executed while executing the first sub-processing.

2. The design support device according to claim 1, wherein
the second sub-processing is repeated while executing the first sub-processing in the one of the first processes, and
the repetition of the second sub-processing is stopped according to a completion of the first sub-processing in the one of the first processes.

3. The design support device according to claim 1, wherein
the score is calculated by inputting the characteristic value to an objective function,
the first function is calculated by a Bayesian inference based on the history data, and
the new control value group is set based on the first function.

4. The design support device according to claim 1, wherein
the control value group further includes at least one selected from the group consisting of a first voltage value applied to the first gate, a second voltage value applied to the second gate, a first electrical resistance of the first gate, and a second electrical resistance of the second gate.

5. The design support device according to claim 1, wherein
the output result includes a change of a current over time, and a change of a voltage over time, and
the characteristic value includes a power loss.

6. The design support device according to claim 1, wherein
the plurality of gates further includes a third gate,
the control value group further includes a second time difference between the first timing and a third timing, and
a voltage is applied to the third gate at the third timing.

7. The design support device according to claim 1, wherein
the semiconductor element includes an IGBT.

8. A design support system, comprising:
the design support device according to claim 1;
a drive circuit inputting the electrical signal to the semiconductor element, and
a detection circuit detecting an output from the semiconductor element and generating the output result.

9. A design support method, comprising:
executing a first processing,
the first processing including
setting a control value group for a semiconductor element, the semiconductor element including a plurality of gates, the plurality of gates including a first gate and a second gate, the control value group including a first time difference between a first timing at which a voltage is applied to the first gate and a second timing at which a voltage is applied to the second gate,
calculating a characteristic value from an output result when an electrical signal corresponding to the control value group is input to the semiconductor element, the characteristic value indicating a characteristic of the semiconductor element, and
calculating a first function from history data including not less than one data set, the data set including the control value group and a score based on the characteristic value; and
setting a new control value group by using the first function;
wherein
the first processing is repeatedly executed, and
one of the repeated executions of the first processing includes:
a first sub-processing that includes the calculating of the first function; and
a second sub-processing that includes the setting of the control value group and the calculating of the characteristic value, and
the second sub-processing is executed while executing the first sub-processing.

10. The method according to claim 9, wherein
the second sub-processing is repeated while executing the first sub-processing in the one of the first processes, and
the repetition of the second sub-processing is stopped according to a completion of the first sub-processing in the one of the first processes.

11. A design support device, comprising:
a processing circuit;
a memory storing instructions that, when executed by the processing circuit, enable the processing circuit to execute a first processing,
the first processing including
setting a control value group for a semiconductor element, the semiconductor element including a plurality of gates, the plurality of gates including a first gate and a second gate, the control value group including a first time difference between a first timing at which a voltage is applied to the first gate and a second timing at which a voltage is applied to the second gate,
calculating a characteristic value from an output result when an electrical signal corresponding to the control value group is input to the semiconductor element, the characteristic value indicating a characteristic of the semiconductor element, and
calculating a first function from history data including not less than one data set, the data set including the control value group and a score based on the characteristic value,
the processing circuit setting a new control value group by using the first function, wherein:
the output result includes a change of a current over time, and a change of a voltage over time, and
the characteristic value includes a power loss.

* * * * *

UNITED STATES PATENT AND TRADEMARK OFFICE
CERTIFICATE OF CORRECTION

| | |
|---|---|
| PATENT NO. | : 11,531,063 B2 |
| APPLICATION NO. | : 17/411888 |
| DATED | : December 20, 2022 |
| INVENTOR(S) | : Tatsunori Sakano et al. |

It is certified that error appears in the above-identified patent and that said Letters Patent is hereby corrected as shown below:

On the Title Page

Item [54], and In the Specification Column 1 Line 1 delete "SUPPORT DEVICE" and insert --DESIGN SUPPORT DEVICE--.

Signed and Sealed this
Eleventh Day of July, 2023

Katherine Kelly Vidal
*Director of the United States Patent and Trademark Office*